(12) United States Patent
Chen

(10) Patent No.: US 6,466,063 B2
(45) Date of Patent: Oct. 15, 2002

(54) PUSH-PULL OUTPUT BUFFER WITH GATE VOLTAGE FEEDBACK LOOP

(75) Inventor: Chung-Hui Chen, Hsin-Chu (TW)

(73) Assignee: Taiwan Semiconductor Manufacturing Co., Ltd., hsin chu (TW)

( * ) Notice: Subject to any disclaimer, the term of this patent is extended or adjusted under 35 U.S.C. 154(b) by 0 days.

(21) Appl. No.: 09/812,512

(22) Filed: Mar. 20, 2001

(65) Prior Publication Data

US 2002/0135405 A1 Sep. 26, 2002

(51) Int. Cl.$^7$ .................................................. H03K 3/00
(52) U.S. Cl. .......................... 327/112; 327/170; 326/83
(58) Field of Search .......................... 327/108–112, 170, 327/434, 436, 437; 326/21, 27, 82, 83

(56) References Cited

U.S. PATENT DOCUMENTS 5,877,647 A  * 3/1999 Vajapey et al. ............. 327/112
6,054,875 A  * 4/2000 Wayner ...................... 327/108

* cited by examiner

Primary Examiner—Kenneth B. Wells
(74) Attorney, Agent, or Firm—Tung & Associates

(57) ABSTRACT

A push-pull output buffer for use with an integrated circuit, such as a CMOS device, uses a driver gate voltage Feedback loop to control slew rate of the driver and reduce crowbar current. The feedback loop is coupled with the driver's control gate and functions to drive the gate up to an initial, intermediate level of voltage. A delay circuit coupled between the driver control gate and the buffer input delays the delivery of a control signal that couples the driver control gate to a higher level of voltage, such that an external load connected to the buffer's output is also driven to a higher level. A one way switch circuit coupled between the delay circuit and the feedback loop prevents interference there between until the higher level of voltage is applied to the control gate.

11 Claims, 3 Drawing Sheets

PUSH-PULL OUTPUT BUFFER WITH GATE VOLTAGE FEEDBACK LOOP

FIELD OF THE INVENTION

The present invention broadly relates to output buffers used to reduce current and voltage spikes produced by power transistors, and deals more particularly with an output buffer having a gate voltage feedback loop for controlling slew rate and reducing crowbar current.

BACKGROUND OF THE INVENTION

Output buffers are used in integrated circuits to drive external loads. Typically the size of the load is not always known in advance, consequentially most output buffers are designed to provide enough current to drive loads up to a maximum permissible level. This is normally accomplished by providing an output transistor that is large enough to drive the maximum permissible load, and by providing a number of smaller transistors coupled in parallel to drive that maximum load.

Continuing advancements in integrated circuit technology have lead to improvements in the speed of integrated circuits, i.e. the time in which the output of a circuit reacts in response to a new input. Increasing integrated circuit speed had resulted in faster rise and fall times of the output voltage. Similarly, the fast rise and fall times of the output voltage result in abrupt transitions in output current. In the case of output buffers used with power transistors, a problem is encountered when the output buffer is quickly turned on or off. Because the current flow is so large, fast switching of prior art buffers can produce transients such as noise spikes on the power, ground or data busses, which result in data errors, latch-up and other problems in digital electronic circuitry.

One solution to this problem involves a technique referred to as slew-rate control. Slew-rate control is designed as the rate of output transition of the buffer in terms of volts per unit time. Conventional digital buffers with slew-rate control use a number of parallel transistors which can be sequentially turned on the reduce the abruptness of the transition and thereby reduce the above mentioned transients.

The transistor section of a digital output buffer can be arranged as a network which can pull up the output of a buffer to a certain voltage level, and a pull-down network which can pull down the output of the buffer to a different, lower voltage. Such an arrangement is sometimes referred to a push-pull output buffer. Because of the time delay involved in sequentially turning on the transistors of each network, a problem is sometimes encountered with slew-rate control when one of the networks of the buffers is being slowly turned on while the other network of the buffer is being slowly being turned off. The problem resides in the fact that for a brief period of time, both networks are turned on. In other words, the network being turned on becomes active before the network being turned off completes its turn-off sequence. As a result, during the period that both networks are active, a very large current known as a "crowbar" current is allowed to flow.

Known prior art arrangements for achieving slew-rate control and reduction of crowbar current have been relatively complicated in terms of the number of components that are required, and have been less than completely effective in providing the requisite level of control. The present invention is directed towards overcoming the disadvantages of the prior art mentioned above.

SUMMARY OF THE INVENTION

According to one aspect of the invention, a push-pull output buffer has a pull-up section, a pull-down section, and a slew-rate control circuit associated with each of the pull-up, pull-down sections for controlling current drivers that control the flow of current at the buffer output. The slew-rate control circuit includes a first voltage supply circuit for supplying an intermediate level of voltage to the current driver, a second voltage supply circuit for supplying a second, higher level of control voltage to the current driver, a delay circuit for delaying the delivery of the second level of voltage to the driver for a prescribed time period, and a logic circuit for controlling the first and second voltage supply circuits so as to achieve a desired slew-rate, while minimizing the flow of any crow bar current. The first voltage supply circuit is preferably in the form of a deep voltage feedback loop that includes transistorized switches for switching a first voltage source into circuit with the gate of the current driver when a network is switched on. The second voltage supply circuit includes a transistorized first gate controlled by the logic circuit and operative to switch a higher level of voltage into circuit with gate of the current driver after a desired time delay following turn on of the network. The delay circuit includes a delay line formed by delay elements that delay the propagation of a control signal that enables the second supply circuit to switch the current driver to a higher voltage level. A one-way switch circuit is used to isolate the delay circuit from the feedback loop to prevent interference there between.

According to another aspect of the invention, a push-pull output buffer is provided for use with an integrated circuit, having an input and an output for driving a load. The buffer includes a pull-up section, a pull-down section and a slew-rate control circuit associated with each of the pull-up and pull-down sections. The pull-up and pull-down sections each include a current driver having a control gate. The slew-rate control circuit controls the rate at which the associated current driver changes the voltage at the buffer output. The slew-rate control circuit includes a gate voltage feedback loop circuit coupled with the driver's control gate for controlling such control gate with a first level voltage, a voltage source for supplying a second level of voltage higher than the first level, a switch circuit for switching a voltage source into circuit with the control gate and a delay circuit for delaying the delivery of the second level of voltage to the control gate.

Accordingly, it is a primary object of the present invention to provide an output buffer for a current producing device such as a CMOS device which includes improved slew-rate control and reduction of crowbar current.

Another object of the invention is to provide an output buffer as described above which provides greater control over the timing of the slew-rate using a minimum number of circuit components.

A still further object of the invention is to provide an output buffer of the type mentioned which is especially simple in design and can be laid out for simplified processing during manufacture thereof.

These, and further objects and advantages of the present invention will be made clear or will become apparent during the course of the following description of a preferred embodiment of the invention.

BRIEF DESCRIPTION OF THE DRAWINGS

In the drawings, which form an integral part of the specification, and are to be read in conjunction therewith, and in which like components are used to designate identical components in the various views.

DETAILED DESCRIPTION OF THE PREFERRED EMBODIMENT

Figure 1:
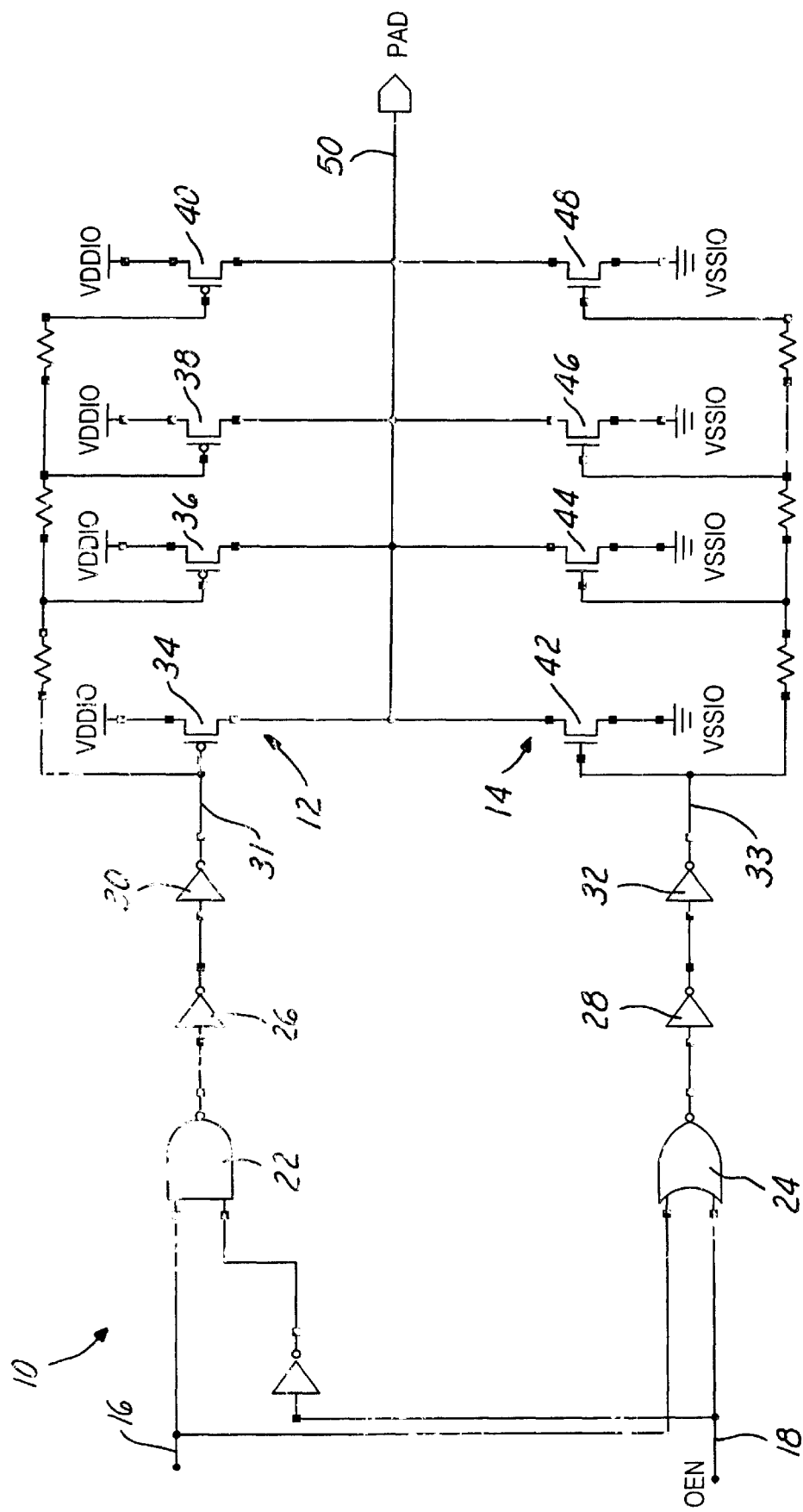
FIG. 1 is a detailed schematic diagram of a digital output buffer exemplary of the prior art.

Referring first to FIG. 1, a typical prior art digital output buffer, generally indicated by the numeral 10, has its input leads 16, 18 connected with the output of an integrated circuit (not shown), such as a MOSFET. The signals received on lines 16 and 18 are processed by a logic circuit and delivered respectively to a pair of driver networks 12, 14. Network 12 includes multiple stages of driving transistors 34–40, each having their drains connected to a voltage source VDDIO and their sources connected to an output line 50 of the buffer 10. The buffer output line 50 is in turn connected to an external load. Similarly, network 14 comprises driver transistors 42–48 arranged in successive stages, each having its drain connected to the output line 50 and its source connected to a voltage VSSIO. The gates of driver transistors 34–40 are controlled by the input signals on lines 16, 18 but are turned on sequentially as a result of the use of resistors RP1, RP2, and RP3 which are respectively connected between the input 31 and the gates of driver transistors 36–40. The resistance provided by resistors RP1, RP2, and RP3 combined with the internal capacitance of driver transistors 34–40, firm an RC time constant that creates a delay in the gate signal at the input 32.

In a similar manner, resistors RN1, RN2, and RN3 are respectively coupled between the gate of driver transistors 44–48 and the input 33 to network 14. Again, the differing RC time constants created by the combination of resistors RN1, RN2, and RN3, and the associated internal capacitance of transistors 42–48 produce an RC time delay in the delivery of the gating signals to driver transistors 44–48, so as to sequentially turn them on. In the case of the particular circuit shown in FIG. 1, transistors 34–40 are PMOS drivers, while transistors 42–48 are NMOS drivers. Network 12 is a pull-up network, while network 14 is a pull-down network. These two networks 12, 14 act as a push-pull buffer that effectively bifurcates the surge of current output on line 50, thus reducing what would otherwise be a very large voltage spike due to the large abrupt transition of the output current.

In operation, in order to turn on the PMOS driver network, the signals on lines 16 and 18 are high and low, respectively. The high signal on line 16 is gated through the NAND gate 22 and is passed through invertors 26, 30 so that the signal pg0 on line 31 is low. The low signal on line 31 is delivered directly to the gate of transistor 34, as well as to the gates of transistors 36–40, respectively through series connected resistors RP1, RP2, and RP3. Transistor 34 is turned on immediately, hereby conducting current to output line 50. However, there is a slight time delay in the turn on of transistor 36 as the result of the RC time delay created by the internal capacitance of transistor 36 combined with the resistance of resistor RP1. The time delay for turning on transistor 38 is even greater since the RC circuit value is greater as the result of the combined series resistance of resistors RP1, RP2. It can be readily appreciated then, that transistors 34–40 are sequentially turned on in a time controlled manner to achieve a desired slew-rate. When PMOS driver network reaches its maximum current value, it is turned off and the NMOS driver network id turned on. In order to turn off network 12 and turn on network 14, the signals on lines 16 and 18 are switched to low and high, respectively. The high signal on line 18 is gated through NOR gate 24 and is twice inverted by invertors 28 and 32 to form a high signal on input line 33. The high signal at input line 33 turns on transistor 42, which brings output line 50 to the voltage of VSSIO. NMOS driver transistors 44–48 are then sequentially turned on with the delay between their turn-on times being determined by the RC networks formed by the internal capacitance of these resistors in combination with the series connected resistors RN1, RN2 and RN3.

A problem exists, however, in that when signals on lines 31 and 33 go low and high respectively, network 14 is turned on instantly but there is a delay before network 12 is turned off. Specifically, transistor 42 begins conducting before transistor 40 is turned off. This overlap is due to the fact that the RC network comprising resistors RP1, RP2 and RP3 combined with the internal capacitance of transistor 40 delays the delivery of the low signal on line 31 to the gate of transistor 40. As a result, if transistors 40 and 42 are simultaneously conducting, a crow bar current is created since both the VDDIO sand VSSIO are simultaneously connected to the output buffer line 50. This crow bar current is both power consuming and created electrical noise in the output signal.

Figure 2:
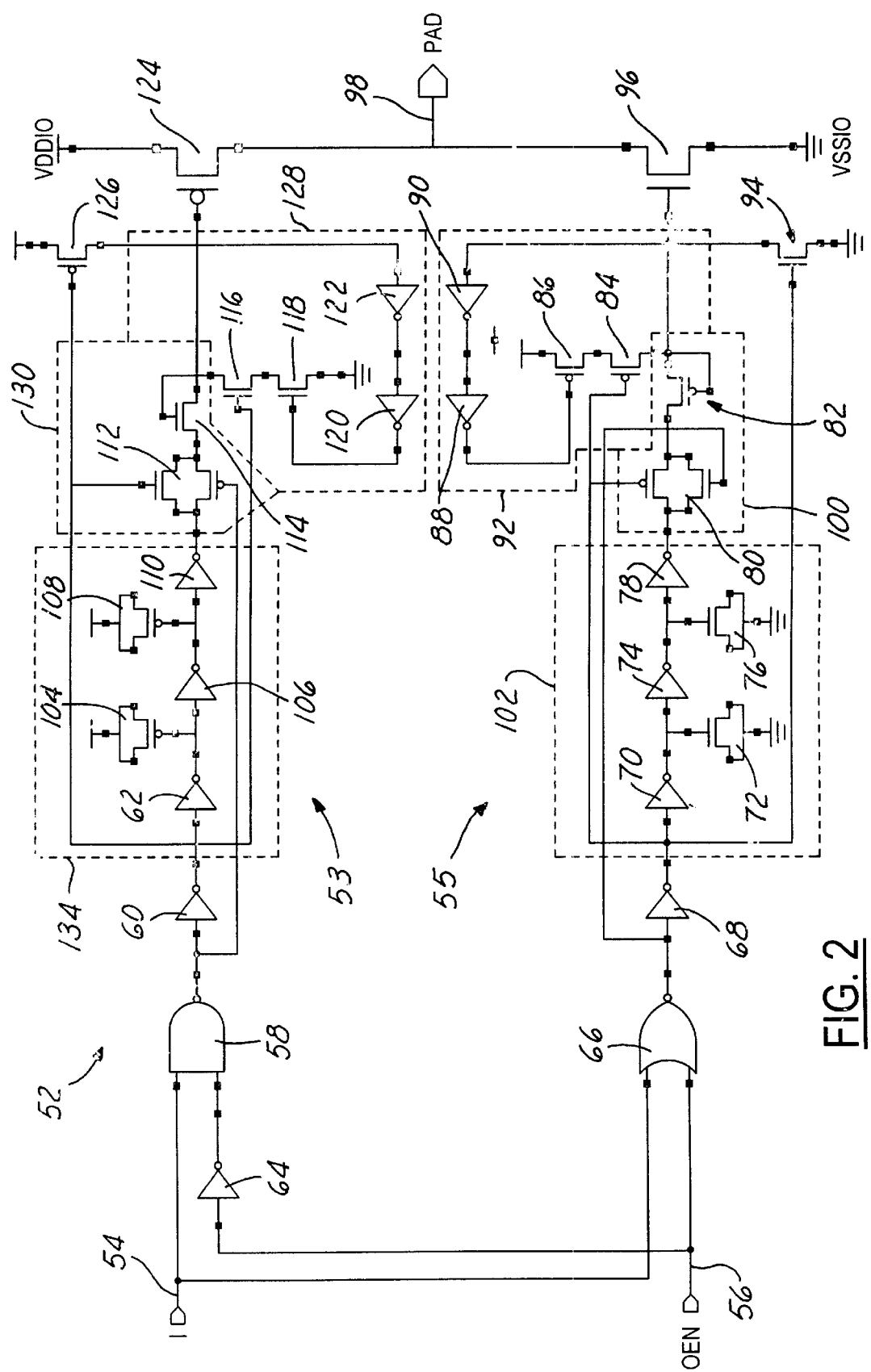
FIG. 2 is a detailed schematic diagram of a push-pull output buffer which forms the preferred embodiment of the present invention.

Attention is now directed to FIG. 2 which depicts novel push-pull output buffer, generally designated by the numeral 52, in accordance with the preferred embodiment of the present invention. Output buffer may be used with a CMOS device, such as a MOSFET (not shown), and broadly comprises a pair of push-pull networks 53, 55 which are coupled between a pair of buffer inputs 54, 56, and an output line 98 that is connected to an external load (not shown). The push-pull networks 53, 55 are essentially identical except that the push network 55 pushes the voltage up on output line 98, while the pull network 53 pulls down the voltage on line 98. A logic circuit processes the signals input on lines 54 and 56. This logic circuit comprises AND gate 58, NOR gate 66, and invertors 60, 64 and 68. One of the inputs to NAND gate 58 is coupled directly with input lime 54, while the second input to such gate is coupled through inverter 64 to input line 66. NOR gate 66 has its two input lines respectively connected to input lines 54, 56. The pull-down network 55 broadly comprises a single driver transistor 96 having a source connected to a voltage VSSIO and a drain connected to the buffer output line 98. The pull-down network 55 further includes a gate control feedback loop circuit 92 coupled with the gate of driver 96, As well as a switch 100 and a delay circuit 102. Delay circuit 102 includes series connected invertors 70, 74 and 78, as well as a pair of delay elements in the form of passgates 72, 76. Passgates 72, 76 effectively delay the propagation of a signal output from inverter 68 to the switch 100.

The feedback loops 92 include a pair of invertors 88, 90 coupled with the gate (ngate 1) of a transistor switch 86 whose source to drain path is connected with a voltage source and the source to drain path of a second transistor switch 84. The gate of switch 84 is connected to receive the signal output from node n4 followed by the output of inverter 68. The signal present on node n4 also is connected to and controls the gate of a transistor switch 94. The source to drain path of transistor 94 is coupled with the gate of driver 96.

Switch 100 comprises a pair of passgates, as well as a second passgate 82 whose source to drain path is coupled between the gate of driver 96 and passgates 80. The control gates of passgate 80 receive control signals from the output of NOR gate 66, while the gate of passgate 82 is controlled by the ngate signal.

As will be described in more detail below, the gate voltage feedback loop circuit 92 functions to provide a first, intermediate level of voltage at the control gate of driver 96, thereby causing driver 96 to drive the output load on line 98 at an intermediate, moderate level for a pre-determined length of the time. This time period is determined in part by a time delay produced by time delay circuit 102. After the desired time delay, switch 100 is activated and the time delay circuit 102 is activated so as to connect the control gate of driver 96 with a higher level of voltage which in turn causes driver 96 to drive the external load at a higher current level.

The construction of network 53 is essentially a mirror image of network 55. Network 53 broadly comprises an output driver 124 whose gate is connected to a gate voltage feedback loop 128 that is coupled through a switch 130 to a delay circuit 134. The input to delay circuit 134 is formed by the output of an inverter 60 whose input is connected to the output of NAND gate 58. The delay circuit 134 broadly comprises a pair of passgates 1–4, 108 as well as invertors 62, 106 and 110. The switch 130 includes a pair of complimentary coupled passgates 112 coupled with the output of inverter 60, as well as a passgate 114 whose gate is controlled by the feedback loop circuit 128. Circuit 128 includes a pair of passgates 116, 118, as well as invertors 120, 122. A transistor switch 126 has its gate connected with the output of inverter 60, and includes a source to drain path connected between a voltage source and the gate of driver 124.

The operation of the output buffer will now be described in more detail, and particularly the operation of pull-up network 55. Initially, buffer inputs 54 and 56 are set to high and low respectively. The ngate signal at the gate of driver 96 is pulled low to VSSIO by transistor 94. At this point, the NMOS driver 96 is completely turned off. When buffer input 54 switches from high to low, switch 94 turns off and the ngate signal is initially pulled up by the gate voltage feedback loop circuit 92. Feedback circuit 92 is turned on as the result of the output of inverter 68 switching from high to low, which low signal is delivered to the gate of passgate 84, thereby turning the latter on so as to connect the feedback circuit 92 to the gate of driver 96. At this point, remembering that the ngate signal was originally low and that ngate1 was also low, transistor 86 is therefore on at the time that passgate 84 is turned on to connect the gate of driver 96 to a first, intermediate level of voltage. It can thus be appreciated that the feedback circuit 92 pulls the ngate signal up to a first, intermediate voltage level in a relatively short time.

The voltage of the ngate signal remains at the intermediate level thereof for a period of time determined by the delay circuit 102. Delay circuit 102 effectively delays the time of propagation of the signal output from inverter 68 which is eventually output by inverter 78 to the one-way switch 100. This propagation delay is created as a result of the use of delay elements in the form of the passgates 72,76. When passgate 76 switches from high to low, the ngate signal begins ramping up from the previously mentioned intermediate level of voltage to full voltage VDD. The one-way switch 100 isolates the delay circuit 102 from the feedback circuit 92 to prevent competition there between.

When the input signal on line 54 goes low, the complimentary passgate 80 turns on, thereby connecting the output of inverter 78 with the ngate signal through switch 82. Switch 82 functions as an MOS diode which provides monolithic pull-up of the ngate signal. Since the output of inverter 78 remains low before the signal propagates through the delay circuit 102, the pull-down current provided by the output of inverter 78 would otherwise compete or interfere with the current flow produced by the feedback circuit 92 which is flowing through switches 84, 86 to voltage VDD. Because switch 82 is formed as an MOS diode, an NMOS current can only flow when the ngate signal voltage is lower than the voltage present at the output of inverter 78 by a pre-determined amount. Therefore, prior to the signal passing through the delay circuit 102, switch 82 acts to isolate the output of inverter 78 from the feedback circuit 92. Once the signal passes through circuit 102, the ngate voltage increases from its intermediate level thereof to pull driver voltage and thereby driving the output line 98 and related external load to a the maximum value.

When the pull-up network 55 is turned off and pull-down network 53 is turned on, the input line 54 switched from low to high, switch 94 turns on, thereby pulling down the ngate signal to VSSIO, and immediately turning off driver 96 by virtue of the fact that the gate of switch 94 is connected with the output of inverter 68, and thus is quickly triggered by the transition of the input line 54 from low to high, without any delay. Likewise, passgates 80 have their gates connected to the output of NOR gate 66 and are immediately turned off when the buffer input line 54 switches from low to high. With passgates 80 turned off, the ngate signal cannot be affected by any possible leakage current through delay circuit 102, and is thus pulled down by switch 94. From the immediately foregoing description, it may be appreciated that the network 55 is quickly turned off when the pull-down network 53 is turned on, consequently the possibility of any crow bar currents flowing between networks 53, 55 and the output 98 is essentially eliminated.

The operation of the pull-down network 53 is essentially identical to that previously described with respect to pull-up networks 55.

Figure 3:
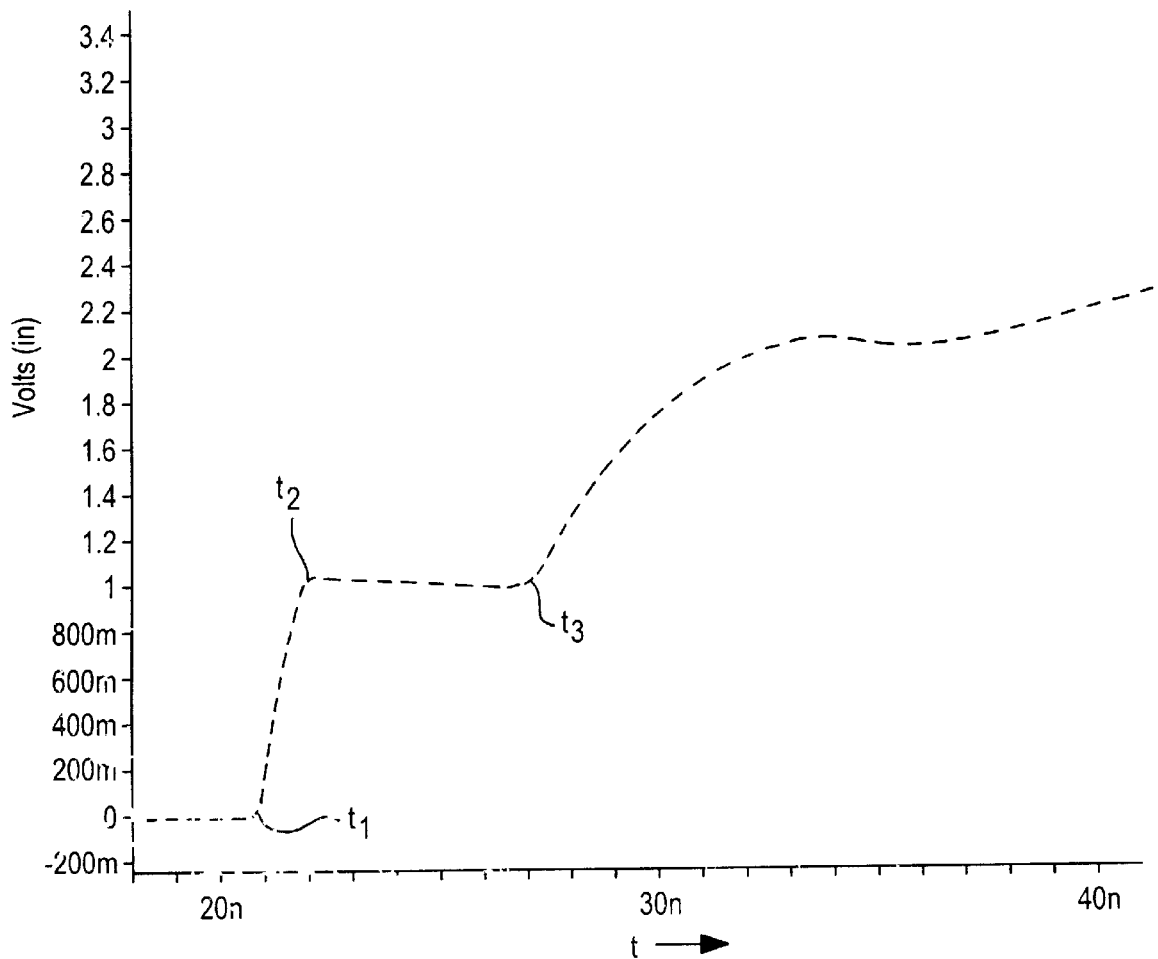
FIG. 3 is a graph of the voltage applied to the current driver forming one of the push-pull networks shown in FIG. 2.

The slew-rate control of the current flow provided by the output buffer 52 shown in FIG. 2 is illustrated in the waveform diagram shown in FIG. 3, which plots voltage of the ngate signal as a function of time, measured in nanoseconds. Initially, the ngate signal is at zero volts at t=0. At 30 ns, the input line 54 is switched from low to high at t1 (30 ns) and the feedback loop circuit 92 pulls up ngate to 1.1 volts at t2 (30.3 ns), at this point, the driver 96 drives the load at a moderate or intermediate level. The ngate signal remains at the intermediate voltage for a time period determined by delay circuit 102, which, in the illustrated embodiment is 3 ns. At the end of the delay period, the output of inverter 78 switches from low to high at t3, and the one way switch 100 turns on, thereby pulling up the ngate signal to a higher voltage level.

From the foregoing it is apparent that the novel output buffer described above not only provides for the reliable accomplishment of the objects of the objects of the invention, but does so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A CMOS push-pull output buffer having an input, and having an output for driving a load, comprising:

a pull up section having a first controllable current driver for pulling up the voltage of said buffer output;

a pull down section having a second controllable current driver for pulling down the voltage of said buffer output; and first and second slew rate control circuits respectively associated with said first and second current drivers for controlling the rate at which the associated current driver changes the voltage at said buffer output, each of said slew rate control circuits including:

(a) first voltage supply circuit for supplying a first, intermediate level of control voltage to the associated current driver, (b) a second voltage supply circuit for supplying a second level of control voltage to said associated current driver higher than said intermediate level, (c) a delay circuit for delaying the delivery of said second level of voltage to said associated current driver, and (d) a logic circuit for controlling said first and second voltage supply circuits.

2. The output buffer of claim 1, wherein:

said associated current driver includes a controllable gate, and said first voltage supply circuit includes a feed back loop coupled with said gate for supplying said first level of voltage to said gate, whereby said associated driver pulls said buffer output to a first voltage level.

3. The output buffer of claim 2, wherein said feedback loop includes a first voltage source, and a switch controlled by said logic circuit for switching said voltage source into circuit with said gate.

4. The output buffer of claim 2, wherein:

said feedback loop further includes a first transistor having a control input coupled with said gate, and having a source-to-drain path coupled with said first voltage source, and said switch includes a second transistor having a source-to-drain path coupled between the source-to-drain path of said first transistor, and having a control input coupled with said logic circuit.

5. The output buffer of claim 1, wherein said delay circuit includes at least one delay element for delaying the propagation of a logic signal produced by said logic circuit.

6. The output buffer of claim 2, wherein said second voltage supply circuit includes a switch coupled with and controlled by said logic circuit for isolating said delay circuit from said feedback loop.

7. The output buffer of claim 1, wherein said switch includes a first passgate coupled with said logic circuit and a second passgate coupled between said first passgate and said feedback loop.

8. For use with an integrated circuit, a push-pull output buffer having an input, and having an output for driving a load, comprising:

a pull up section including a current driver having a control gate, said current driver being operative for pulling up the voltage of said buffer output;

a pull down section including a current driver having a control gate, said current driver being operative for pulling down the voltage of said buffer output; and first and second slew rate control circuits respectively associated with said sections for controlling the rate at which the associated current driver changes the voltage at said buffer output, each of said slew rate control circuits including:

(a) a gate voltage feedback loop circuit coupled with the control gate of the associated section for controlling said control gate with a first level of voltage, said feedback loop including a first switch having a first control input, and a second switch having a second control input, said first control input being coupled with the control gate of the associated section, and said second control input receiving control signals from said buffer input, (b) a voltage source for supplying a second level of voltage higher than said first level, (c) a switch circuit for switching said voltage source into circuit with the control gate of the associated section, whereby the control gate of the associated section is controlled with said second level of voltage, and (d) a delay circuit for delaying the delivery of said second level of voltage to the control gate of the associated section.

9. The output buffer of claim 8, wherein:

said first switch is connected between a voltage source and said second switch, and said second switch is connected between said first switch and the control gate of the associated section.

10. The output buffer of claim 8, wherein said switch circuit includes a first control input for receiving a control signal from said logic circuit, and a second control input for receiving a control signal from said feedback loop circuit.

11. For use with an integrated circuit, a push-pull output buffer having an input, and having an output for driving a load, comprising:

a pull up section including a current driver having a control gate, said current driver being operative for pulling up the voltage of said buffer output;

a pull down section including a current driver having a control gate, said current driver being operative for pulling down the voltage of said buffer output;

first and second slew rate control circuits respectively associated with said sections for controlling the rate at which the associated current driver changes the voltage at said buffer output, each of said slew rate control circuits including:

(a) a gate voltage feedback loop circuit coupled with the control gate of the associated section for controlling said control gate with a first level of voltage, (b) a voltage source for supplying a second level of voltage higher than said first level, (c) a switch circuit for switching said voltage source into circuit with the control gate of the associated section, whereby the control gate o the associated section is controlled with said second level of voltage, said switch circuit including a first control input for receiving a control signal from said logic circuit, and a second control input for receiving a control signal from said feedback loop circuit, and (d) a delay circuit for delaying the delivery of said second level of voltage to the control gate of the associated section; and, a logic circuit coupled between said buffer input and the combination of said feedback loop circuit, said switch circuit and said delay circuit.

* * * * *